United States Patent
Zhang et al.

(10) Patent No.: US 8,093,957 B1
(45) Date of Patent: Jan. 10, 2012

(54) METHOD AND APPARATUS FOR FREQUENCY COMPENSATION FOR MULTI-BAND VCO

(75) Inventors: Liang Zhang, Shanghai (CN); Yong Wang, Shanghai (CN); Xin Liu, Shanghai (CN); Yu Zhang, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 178 days.

(21) Appl. No.: 12/561,166

(22) Filed: Sep. 16, 2009

(51) Int. Cl.
*H03B 5/12* (2006.01)

(52) U.S. Cl. ........... 331/177 V; 331/117 FE; 331/176; 331/36 C (58) Field of Classification Search ........... 331/177 V, 331/167, 117 FE, 36 C
See application file for complete search history.

(56) References Cited

U.S. PATENT DOCUMENTS

| 7,109,815 B1 * | 9/2006 | Groe et al. ............ 331/179 |
| 7,692,500 B1 * | 4/2010 | Koukab et al. ......... 331/17 |
| 2008/0174379 A1 * | 7/2008 | Chen ................ 331/177 V |

* cited by examiner

*Primary Examiner* — Joseph Chang
(74) *Attorney, Agent, or Firm* — Heimlich Law, PC; Alan Heimlich, Esq.

(57) ABSTRACT

A method and apparatus for frequency compensation for multi-band VCO have been disclosed where a VCO tank loading capacitance is adjusted slowly to allow VCO operation in a linear range.

20 Claims, 7 Drawing Sheets

FIG. 7

METHOD AND APPARATUS FOR FREQUENCY COMPENSATION FOR MULTI-BAND VCO

FIELD OF THE INVENTION

The present invention pertains to current Voltage Controlled Oscillators (VCO). More particularly, the present invention relates to a method and apparatus for frequency compensation for multi-band VCO.

BACKGROUND OF THE INVENTION

Figure 3:
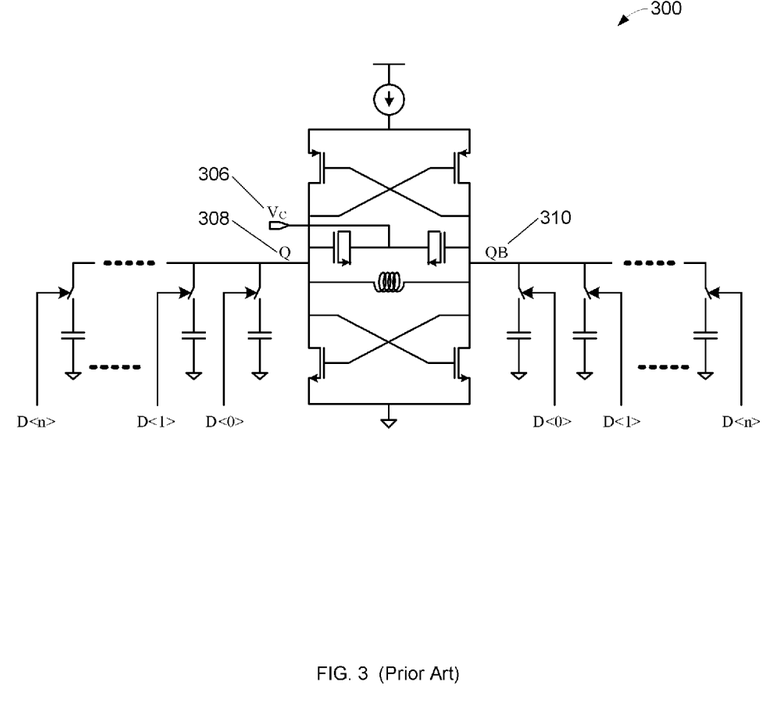
FIG. 3 illustrates a prior approach.

In recent years, wideband high performance synthesizers have been widely employed in various applications, most of which are implemented with a multi-band VCO to cover a wide frequency range, as shown, for example, generally at 300 in FIG. 3. It is preferable to have a small gain for VCO to achieve better performance. Unfortunately, however, this gain must be able to cover the frequency deviations due to temperature change, and crystal wander, because it is undesirable to change the band control code (D<0:n>) once the synthesizer has been locked. This frequency deviation is generally at least several percentages around the center oscillation frequency. What's more, if the center frequency is very high, the issue is more severe. For instance, if the center frequency is 6 GHz, the frequency deviation is 20000 ppm, and the control voltage range is 1V, the corresponding VCO gain should be 240 MHz/V. This value is usually unacceptable in high performance synthesizer design. Thus, it is urgently desirable to find a technique to decouple this trade-off.

BRIEF DESCRIPTION OF THE DRAWINGS

The invention is illustrated by way of example and not limitation in the figures of the accompanying drawings in which.

SUMMARY OF THE INVENTION

A method and apparatus for frequency compensation for multi-band VCO is disclosed. In one approach an apparatus using a state machine driven by comparing control voltages slowly adds or removes capacitance to the multi-band VCO are disclosed. These and other embodiments of the present invention are described in the writings and drawings herewith.

DETAILED DESCRIPTION

In one embodiment of the invention, a novel frequency compensation technique, which compensates for frequency offset caused by temperature changes, and crystal wandering operates in the background. The technique makes a VCO with very small tuning gain feasible.

Figure 4:
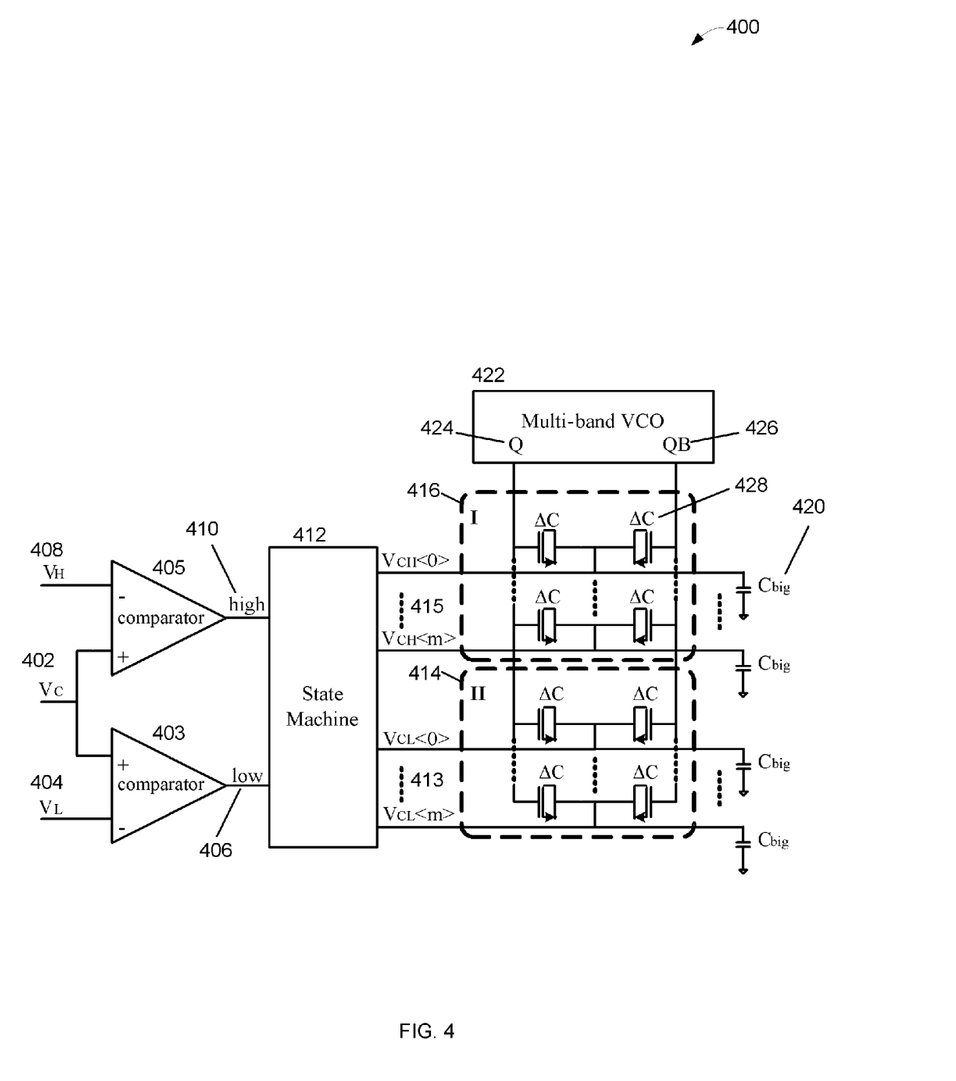
FIG. 4 illustrates one embodiment of topology for the invention.

FIG. 4 illustrates, generally at 400, one embodiment of the invention showing a circuit topology. In FIG. 4, the Multi-band VCO 422 with outputs 424 and 426 is, for example, as shown in FIG. 3 generally at 300, and outputs 308 and 310 respectively. Two varactor banks, which are shown in dashed box labeled I and II (416, and 414) respectively, are added at the output nodes (424, 426) of the multi-band VCO (422). Each varactor bank includes (m+1) varactor pairs with the same variable capacitance ΔC (shown representatively at 428). $V_H$ 408 is input to comparator 405, $V_L$ is input to comparator 403, and $V_C$ 402 (such as at 306 in FIG. 3) is input to comparators at 403 and 405. The output 410 of comparator 405 is fed into State Machine 412. The output 406 of comparator 403 is fed into State Machine 412. State Machine 412 has a series of outputs $V_{CL}$<0 . . . m> and $V_{CH}$<0 . . . m> represented respectively 413 and 415 entering 414 and 416 respectively. At 420 is a representative large capacitor $C_{big}$.

Figure 5:
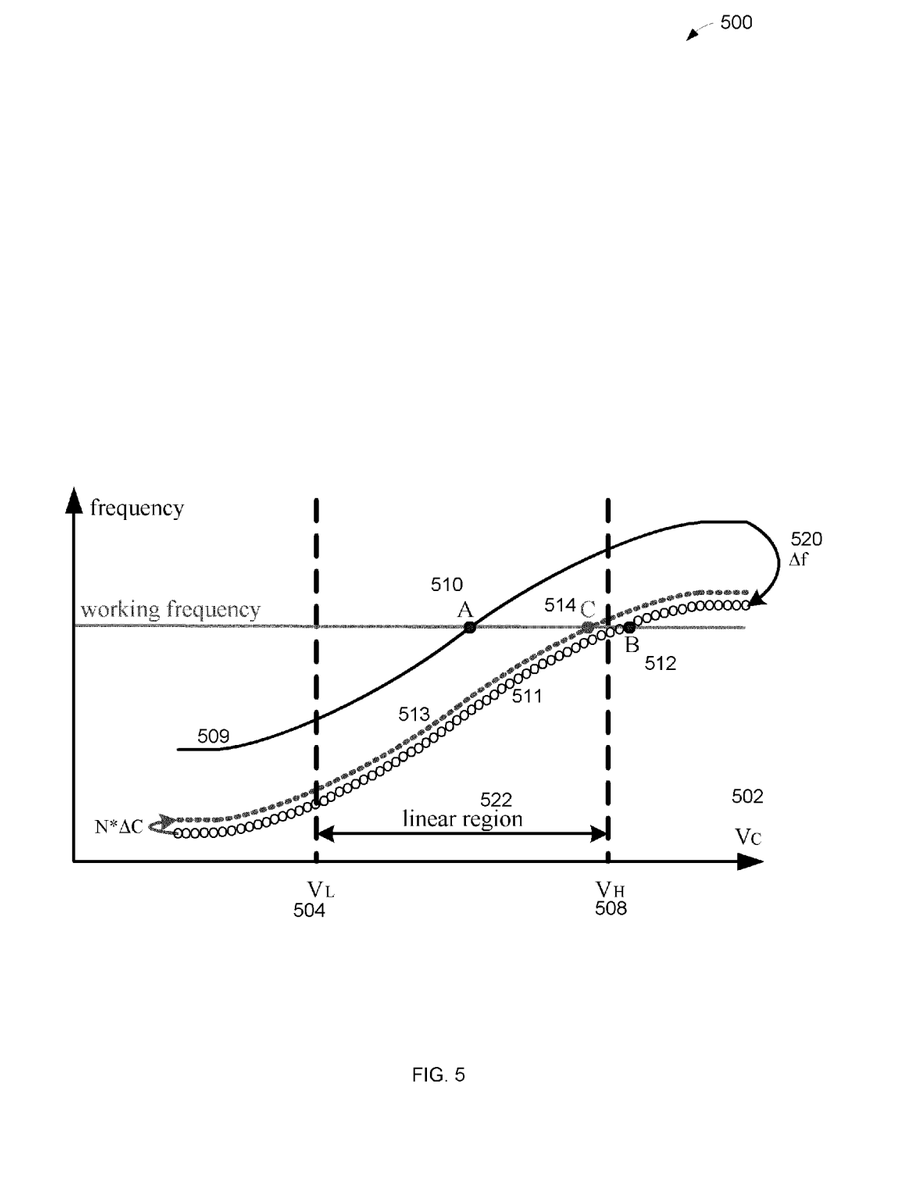
FIG. 5 illustrates one embodiment of frequency compensation for the invention.

FIG. 5 illustrates, generally at 500, one embodiment of the invention showing an example of the frequency compensation technique working. When the digital band selection mechanism (not shown) has selected an optimum working band in sub-bands of a multi-band VCO (the solid curve 509 in FIG. 5), and the synthesizer eventually is locked at point A (510), the synthesizer would operate at a fixed frequency corresponding to point A (labeled working frequency). And the synthesizer should lock at this frequency every time and its performance is kept stable, if no other operation is executed. However, as time passes, the temperature may change or the crystal reference clock may wander, which leads to a frequency deviation (Δf) (520) and the synthesizer may lock instead at point B (512). The point B (512) is located out of the linear region (shown in FIG. 5 at 522) of the synthesizer, and the synthesizer performance would degrade greatly. To avoid this, one could increase the gain of the tuning curve as the traditional way does mentioned in the background section, or use the technique presented herein to compensate this frequency offset. The present technique presented herein is aimed at compensating the frequency offset. We watch the control voltage ($V_C$) 502 (such as 402 in FIG. 4) with two comparators (such as 403, and 405 as shown in FIG. 4). Once the $V_C$ (502) goes out of the linear region 522 between $V_H$ 508 and $V_L$ 504, the state machine (such as 412 in FIG. 4) will give control signals (such as 413 and 415 in FIG. 4) to add or remove one varactor pair to or from the VCO oscillation tank (as attached at Q 424 and QB at 426 via Group I 416 and Group II 414 in FIG. 4) This adding or removing action should be very slow to guarantee the time interval error (TIE) jitter is small enough not to affect performance desired. Thus the user will not be aware of this change.

Figure 6:
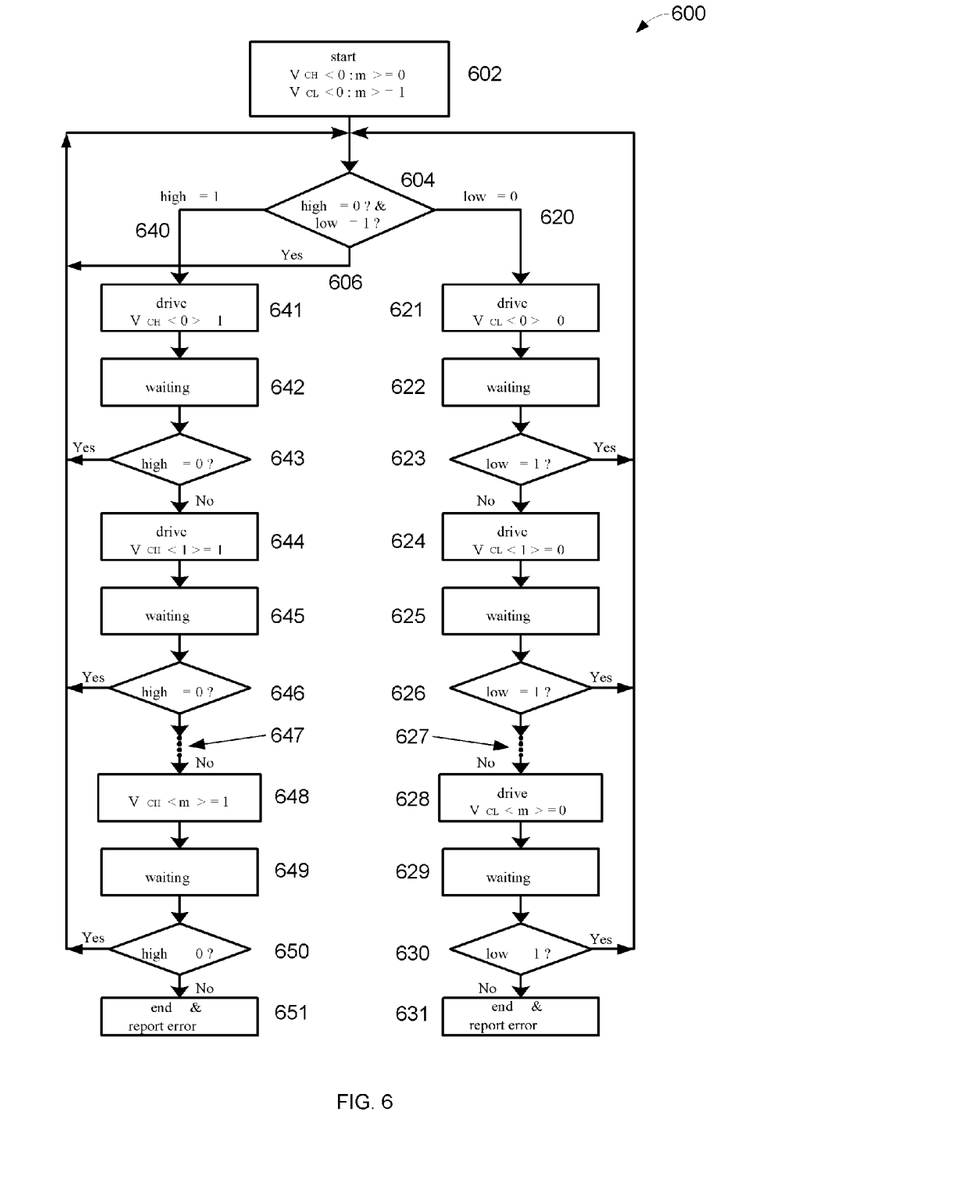
FIG. 6 illustrates one embodiment of the invention in flow chart form.

We examine now in more detail one embodiment of the present invention in operation in FIG. 5. FIG. 5 describes the process of adding a varactor in detail. At the beginning, the synthesizer is locked at point A 510, the two comparators outputs 'high' and 'low' are '0' and '1' respectively (such as respectively in FIG. 4 at 405, 403, 410, 406), and the $V_{CH}$<0:m> (FIG. 4 at 415) are all biased at '0' and the $V_{CL}$<0:m> (FIG. 4 at 413) are all biased at '1'. Then after a long time period, for some reason, the synthesizer frequency decreases by Δf (520), and the $V_C$ 502 (FIG. 4 at 402) will be larger than $V_H$ 508 (FIG. 4 at 408). The signal 'high' (FIG. 4 at 410) changes from '0' to '1'. Then the state machine (FIG. 4 at 412) drives the signal $V_{CH}$<0> from '0' to '1' (FIG. 4 bit 0 of 415). As explained above, this change must be very slow. Thus a big capacitor $C_{big}$ (representatively shown at 420 in FIG. 4) is added to control how slow it is (i.e. changing from state '0' to state '1', and from state '1' to state '0'). After this long period ends, if the state machine (FIG. 4 at 412) still receives a '1' from 'high' signal (FIG. 4 at 410), the state machine (FIG. 4 at 412) will drive $V_{CH}$<1> (FIG. 4 bit 1 of 415) from '0' to '1' slowly. This process continues unless the 'high' signal (FIG. 4 at 410) changes back to '0'. By then, N of (m+1) varactor pairs have been added to the oscillation tank (FIG. 4 at Q and QB, 424 and 426 respectively) and the tuning curve is shifted from "o" dashed line 511 to the dashed line 513 as shown in FIG. 5 where the synthesizer is locked at point C 514 which is now within the linear range 522. Similarly, if the frequency is increased for some reason, the 'low' signal (such as 406 in FIG. 4) will control the state machine (FIG. 4 at 412) to drive several bits of $V_{CL}$<0:m> (FIG. 4 at 413) from '1' to '0' slowly. The operation of one embodiment of a state machine (such as 412 in FIG. 4) is shown in FIG. 6, in which the 'waiting' state stands for the time period needed for driving $V_{CH}$<n> from '0' to '1' or driving $V_{CL}$<n> from '1' to '0' (where 0<n<m). In this way, the $V_C$ (such ad 502 in FIG. 5) will not be out of the linear region (FIG. 5 at 522), and the high performance of the synthesizer can be maintained.

FIG. 6 illustrates, generally at 600, one embodiment of the invention in flow chart form for a state machine such as illustrated in FIG. 4 at 412 with its respective inputs high 410, low 406, and outputs $V_{CH}$<0:m> and $V_{CL}$<0:m>. At 602 the sequence starts with bits $V_{CH}$<0:m> set at 0, and bits $V_{CL}$<0:m> set at 1. At 604 a decision based on the high signal and the low signal. If high=0 and low=1 then the process continues at 604. otherwise if low=0 then we proceed down path 620, and if high=1 then we proceed down path 640. At 621 we drive bit $V_{CL}$<0> to 0. At 622 we enter waiting as noted above, the 'waiting' state stands for the time period needed for driving a bit in a slow fashion so as to not upset the VCO. After waiting 622 we check to see if low=1 623 and if so we continue at 604 otherwise we proceed to 624 and we drive bit $V_{CL}$<1> to 0. We then enter waiting 625. After waiting 625 we check to see if low=1 626 and if so we continue at 604 otherwise we proceed to repeat driving and waiting and checking as done above for bits 0 and 1 with increasingly higher bits 2, 3, ... denoted as 627, until at 628 we reach the most significant bit m which we drive bit $V_{CL}$<m> to 0. We then enter waiting 629. After waiting 629 we check to see if low=1 630 and if so we continue at 604 otherwise we have run out of bits to control and at 631 we end and report an error.

If at 604 a decision is made to proceed down path 640, then at 641 we drive bit $V_{CH}$<0> to 1. At 642 we enter waiting as noted above, the 'waiting' state stands for the time period needed for driving a bit in a slow fashion so as to not upset the VCO. After waiting 642 we check to see if high=0 643 and if so we continue at 604 otherwise we proceed to 644 and we drive bit $V_{CH}$<1> to 1. We then enter waiting 645. After waiting 645 we check to see if high=0 646 and if so we continue at 604 otherwise we proceed to repeat driving and waiting and checking as done above for bits 0 and 1 with increasingly higher bits 2, 3, ... denoted as 647, until at 648 we reach the most significant bit m which we drive bit $V_{CH}$<m> to 1. We then enter waiting 649. After waiting 649 we check to see if high=0 650 and if so we continue at 604 otherwise we have run out of bits to control and at 651 we end and report an error.

Figure 7:
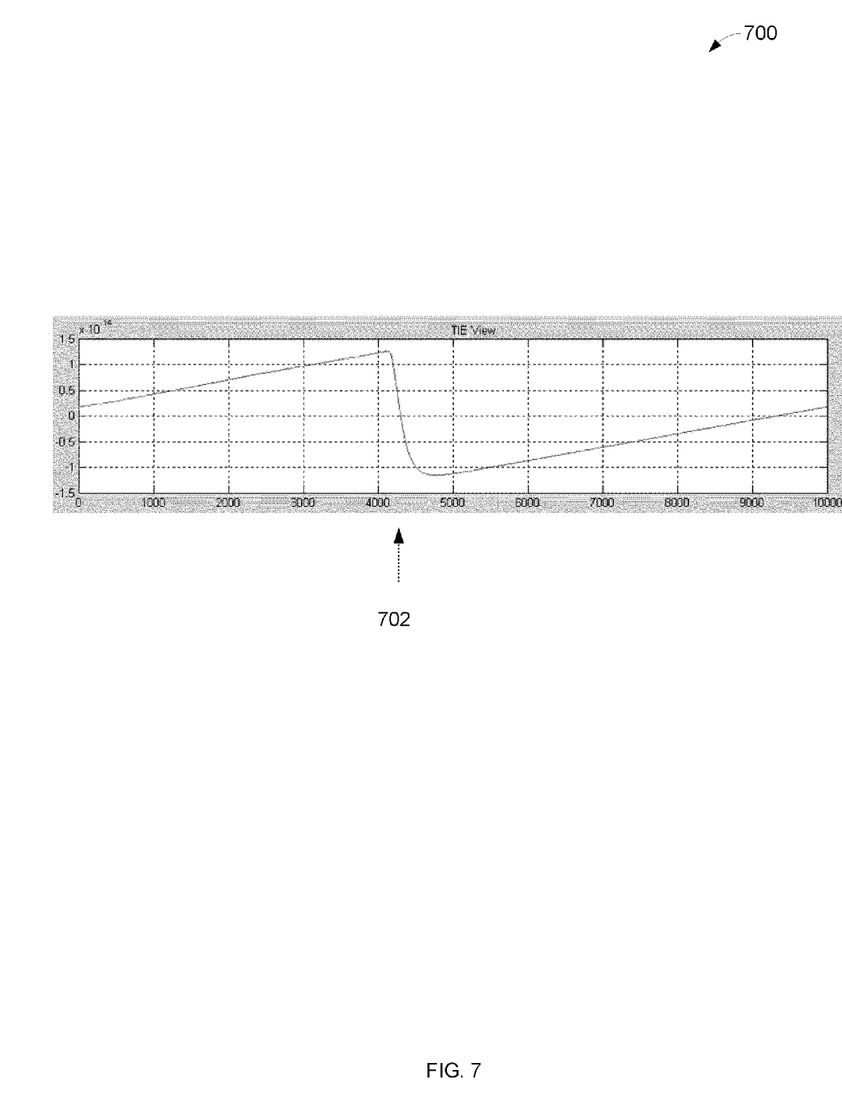
FIG. 7 illustrates one embodiment of the invention showing TIE (time interval error) jitter.

FIG. 7 illustrates, generally at 700, one embodiment of the invention showing TIE (time interval error) jitter. An example will be given to illustrate one embodiment of the invention. In practical applications, the maximum frequency offset due to temperature and crystal wander is mostly in the range of ±2% from the center frequency. Thus for a 6 GHz center frequency, the maximum offset is ±120 MHz. Set the VCO gain ($K_{VCO}$) be 10 MHz/V (small enough gain for most applications), and $\Delta C/2$=2.5 fF (divide by 2 because there are 2 capacitors in serial). For 6 GHz and a 0.5 pH inductance, $AC/2$=2.5 fF corresponds to a 5.3 MHz frequency offset. This frequency offset value should be chosen as close as possible to $K_{VCO}/2$ to make the synthesizer locking point move back to the center of the tuning curve eventually. To cover a ±120 MHz frequency deviation, we need at least 46 pairs of compensation varactor banks with 23 pairs of them biased from '0' (for example, dashed box I 416 in FIG. 4) and 23 pairs of them biased from '1' (for example, dashed box II 414 in FIG. 4) at the initial state.

Next we decide how slow the varactors should be switched. If the loop bandwidth=300 kHz, $C_{big}$=10 pF, and the driving capability of the state machine output stage is 10 nA (e.g. need a transistor with W/L<<1), then the slow rate of the $V_{CH}$<n> or $V_{CL}$<n> (0<n<m+1) should be 1000V/sec. And with this setting, we can get the TIE jitter due to this switching, which is shown in FIG. 7.

The big jump 702 shown in FIG. 7 corresponds to the largest TIE introduced by the switching event. The TIE jitter due to the switching is in the range of $\pm 1.5*10^{-14}$ second, and this jitter is small enough, which will not cause synthesizer phase noise degradation. The whole procedure is completed in the range of several milliseconds. This time interval is fast enough to respond to a frequency deviation.

A novel frequency compensation technique has been presented here. By utilizing this technique, one can design a high performance synthesizer with a very small VCO tuning gain without considering frequency deviation due to temperature or reference crystal wandering. This technique compensates the frequency deviation with two extra arrays of compensating varactor banks, which are added to or removed from the oscillation tank very slowly. The compensation procedure completes in the background and is transparent to users.

Thus a method and apparatus for frequency compensation for multi-band VCO have been described.

Figure 1:
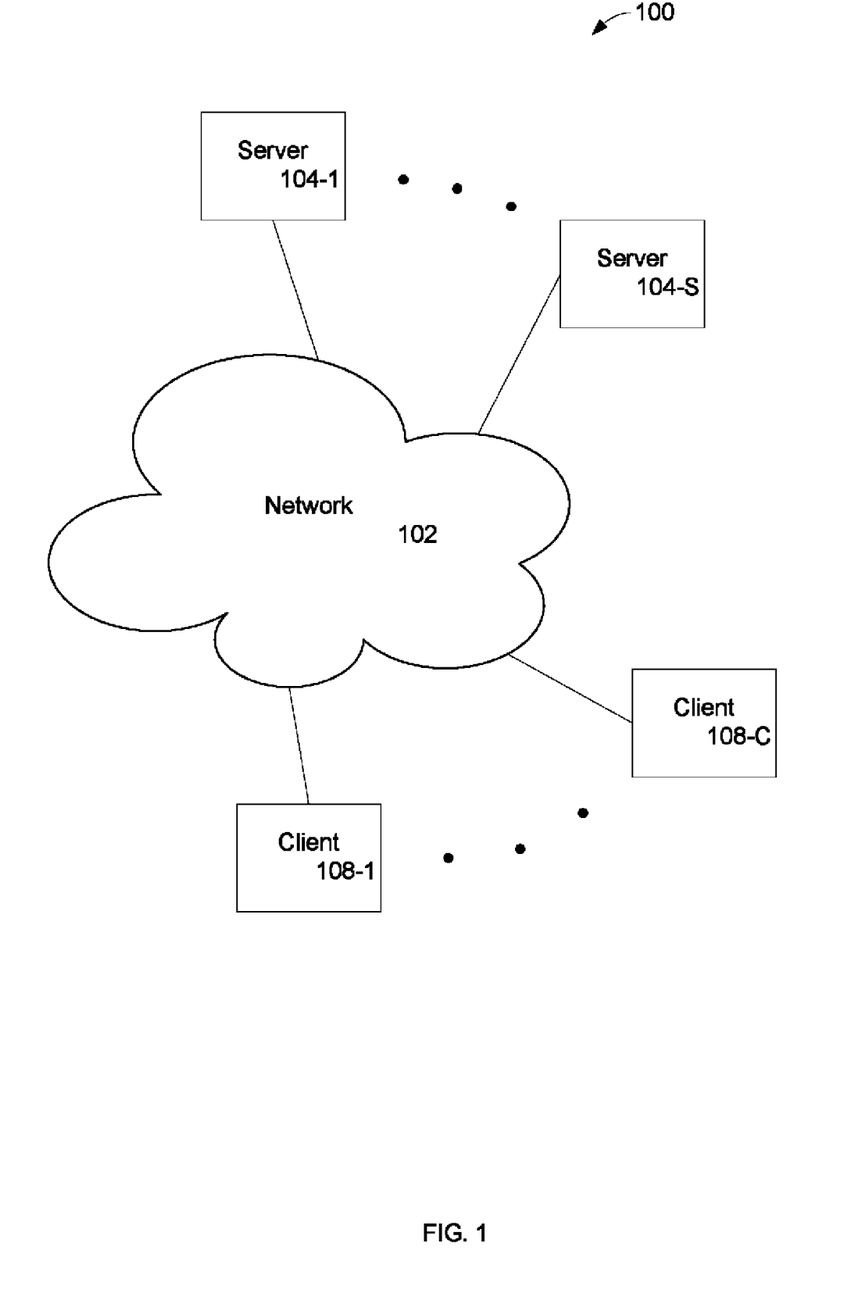
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
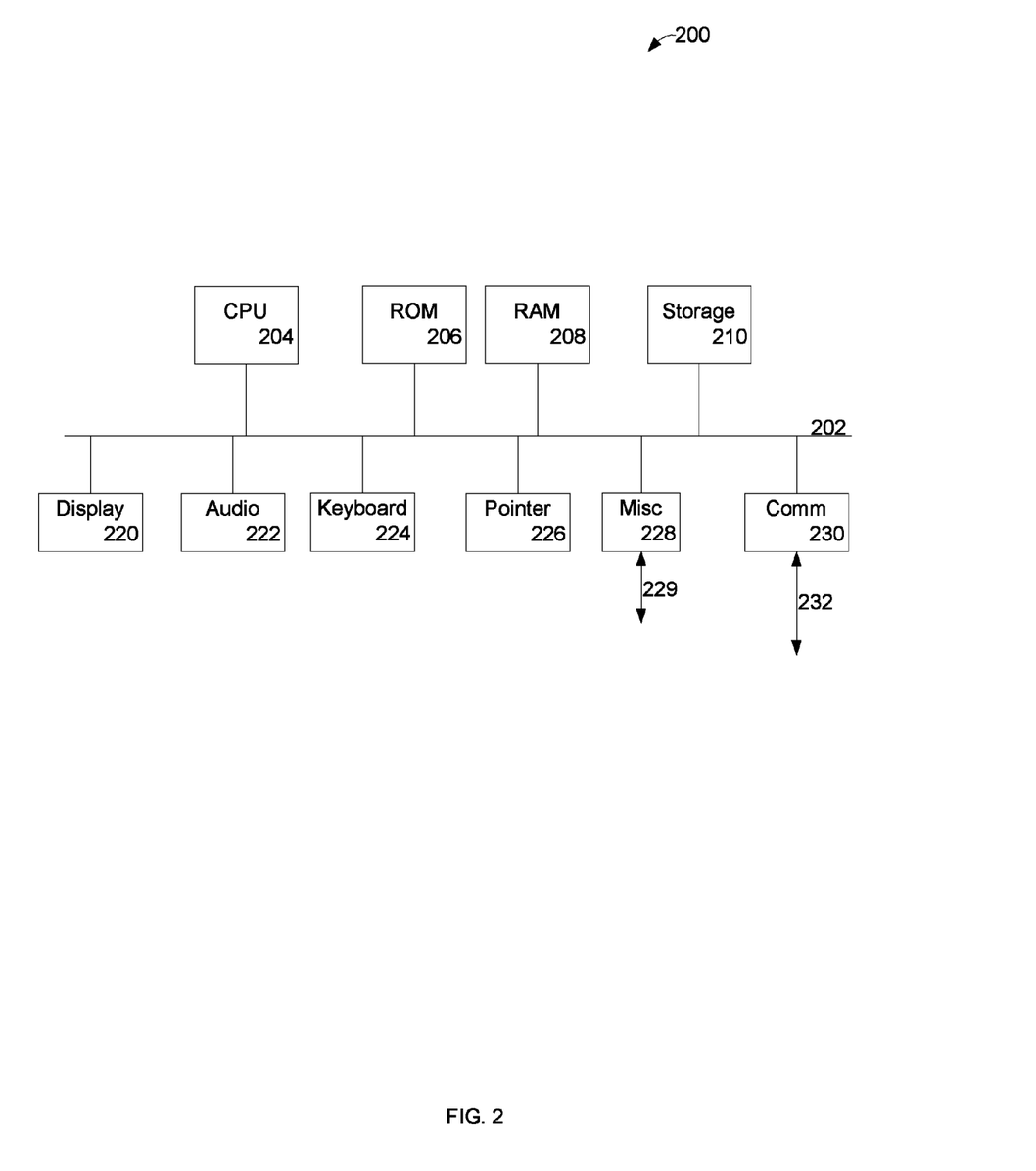
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Various spellings may be used for terms used in the description. These variations are to be understood to relate to the same term unless denoted otherwise. For example: failsafe is also spelled fail safe, and failsafe; start-up is also spelled startup, and start up; subthreshold is also spelled sub-threshold, and sub threshold; etc.

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as "substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for frequency compensation for multi-band VCO have been described.

What is claimed is:

1. An apparatus comprising:
    a voltage controlled oscillator (VCO) having an output (Q) and an inverted output (QB), a control voltage (VC), and a generally linear range of VC operation from VH to VL;
    a first bank of varactors coupled between said Q and said QB;
    a second bank varactors coupled between said Q and said QB; and
    a state machine having an input coupled to receive a first reference voltage equal to VH, said state machine having an input coupled to receive a second reference voltage equal to VL, said state machine having an input coupled to receive said VC, and said state machine having a plurality of outputs coupled to control said first bank of varactors and said second bank of varactors, and wherein said first bank of varactors and said second bank of varactors do not have a common connection point.

2. The apparatus of claim 1 wherein said first bank of varactors coupled between said Q and said QB comprises a first plurality of first pairs of varactors.

3. The apparatus of claim 2 wherein said first pairs of varactors are connected in series and are connected between said Q and said QB.

4. The apparatus of claim 3 wherein said second bank of varactors coupled between said Q and said QB comprises a second plurality of second pairs of varactors.

5. The apparatus of claim 4 wherein said second pairs of varactors are connected in series and are connected between said Q and said QB.

6. The apparatus of claim 5 wherein each varactor in said first bank of varactors are substantially the same.

7. The apparatus of claim 6 wherein each varactor in said second bank of varactors are substantially the same.

8. The apparatus of claim 7 wherein said each varactor in said first bank of varactors and said each varactor in said second bank of varactors are substantially the same.

9. The apparatus of claim 5 wherein each of said state machine plurality of outputs is coupled to an entity selected from the group consisting of one or more of said first plurality of first pairs of varactors, and one or more of said second plurality of second pairs of varactors.

10. The apparatus of claim 1 further comprising a means for controlling a rate at which said plurality of outputs change from a first state to a second state.

11. A method comprising:
    comparing a control voltage against a reference high voltage and generating a first output;
    comparing said control voltage against a reference low voltage and generating a second output; and
    using said first output and said second output to generate a plurality of outputs wherein each of said plurality of outputs is connected to control a pair of varactors, and wherein a plurality of said pair of varactors do not have a common connection point.

12. The method of claim 11 further comprising controlling a rate at which each of said plurality of outputs changes state.

13. The method of claim 12 further comprising connecting each of said pair of varactors between an output of a voltage controlled oscillator and an inverted output of said voltage controlled oscillator.

14. A method for controlling capacitance between outputs of a voltage controlled oscillator (VCO), the method comprising:
    receiving a high voltage reference (VH) for a substantially linear range of said VCO operation;
    receiving a low voltage reference (VL) for a substantially linear range of said VCO operation;
    receiving a control voltage (VC) for said VCO;
    setting all bits of a high control (VCH) to 0;

setting all bits of a low control (VCL) to 1;
comparing said VC and said VH and generating a signal
  denoted high compare (hc);
comparing said VC and said VL and generating a signal
  denoted low compare (lc);
(a) checking to see if hc=0 and lc=1; and
  if so then continuing at (a);
(b) if lc=0 then:
  (b1) driving a single bit from VCL from a 1 to 0;
  (b2) checking to see if lc=1; and
    if so then continuing at (a);
    if not then checking to see if any bits from VCL are
      still at 1; and
      if so then repeating (b1)-(b2);
      if not end;
(c) if hc=1 then:
  (c1) driving a single bit from VCH from a 0 to 1;
  (c2) checking to see if hc=0; and
    if so then continuing at (a);
    if not then checking to see if any bits from VCH are
      still at 0; and
      if so then repeating (c1)-(c2);
      if not end.

15. The method of claim 14 wherein said any bits from VCL are each connected to a pair of varactors connected in series between said outputs of said VCO.

16. The method of claim 14 wherein said any bits from VCH are each connected to a pair of varactors connected in series between said outputs of said VCO.

17. The method of claim 14 wherein said any bits from VCL are each connected to a first set of pairs of varactors connected in series between said outputs of said VCO, and wherein said any bits from VCH are each connected to a second set of pairs of varactors connected in series between said outputs of said VCO.

18. The method of claim 17 wherein respective bits from VCL and bits from VCH each control pairs of varactors that are substantially a same capacitive value.

19. The method of claim 18 wherein driving a single bit from VCL from a 1 to 0 is done at a controlled rate.

20. The method of claim 18 wherein driving a single bit from VCH from a 0 to 1 is done at a controlled rate.

* * * * *